(12) United States Patent
Swenson et al.

(10) Patent No.: US 6,677,227 B2
(45) Date of Patent: Jan. 13, 2004

(54) METHOD OF FORMING PATTERNED METALIZATION ON PATTERNED SEMICONDUCTOR WAFERS

(75) Inventors: James S. Swenson, El Segundo, CA (US); Robert C. Cole, Rancho Palos Verdes, CA (US)

(73) Assignee: The Aerospace Corporation, El Segundo, CA (US)

( * ) Notice: Subject to any disclaimer, the term of this patent is extended or adjusted under 35 U.S.C. 154(b) by 411 days.

(21) Appl. No.: 09/863,009

(22) Filed: May 21, 2001

(65) Prior Publication Data

US 2002/0173067 A1 Nov. 21, 2002

(51) Int. Cl.[7] .............................................. H01L 21/302
(52) U.S. Cl. ...................... 438/612; 438/613; 438/669; 438/671; 438/673; 438/725; 438/697; 438/699; 438/717; 438/734; 438/736
(58) Field of Search ................................. 438/612, 613, 438/669, 671, 673, 725, 697, 699, 717, 734, 736

(56) References Cited

U.S. PATENT DOCUMENTS 6,417,089 B1 * 7/2002 Kim et al. ................... 438/612
6,586,323 B1 * 7/2003 Fan et al. .................... 438/614

* cited by examiner

*Primary Examiner*—George Goudreau
(74) *Attorney, Agent, or Firm*—Derrick Michael Reid

(57) ABSTRACT

A metalization process forms metal contacts having defined profiles for contact between microelectromechanical (MEMS) devices or chemical sensors with semiconductor devices. Gold contacts may be used for connecting the MEMS devices or chemical sensors to integrated CMOS devices. Gold contacts are deposited over a photoresist via having sidewalls for forming upwardly extending flanges. The metal contacts to the underlying semiconductor device, are formed using a polymethylmethacrylate (PMMA) etch back process for exposing and dissolving the gold metalization layer save the metal contact under a surviving portion of the etched back PMMA layer in a dimple of the gold layer over the photoresist via. The photoresist layer serves to form deep well gold contacts having upwardly extending flanges for connection to the MEMS devices or chemical sensors and to the integrated semiconductor devices.

19 Claims, 2 Drawing Sheets

GOLD CONTACT PMMA ETCH BACK PROCESS

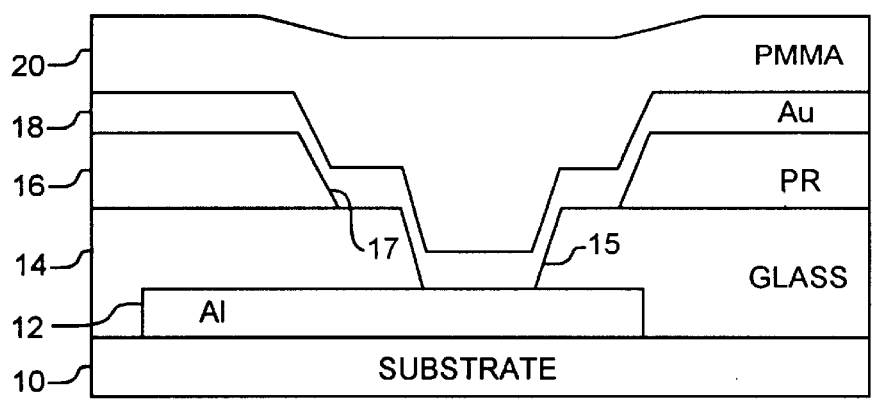
FIG. 1A    Al, GLASS, PR, AU, AND PMMA DEPOSITION
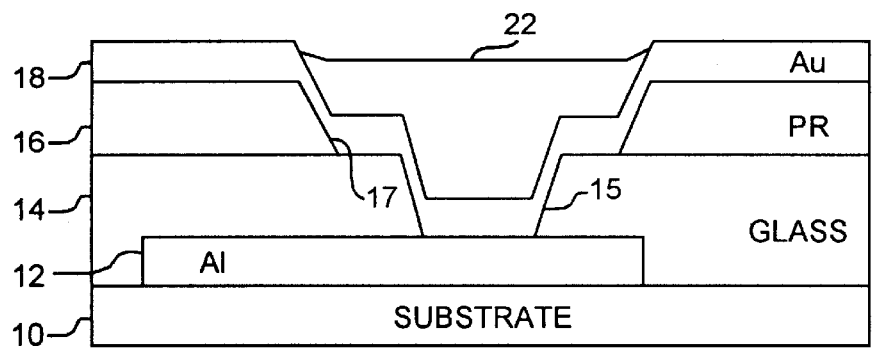
FIG. 1B    PMMA ETCH BACK
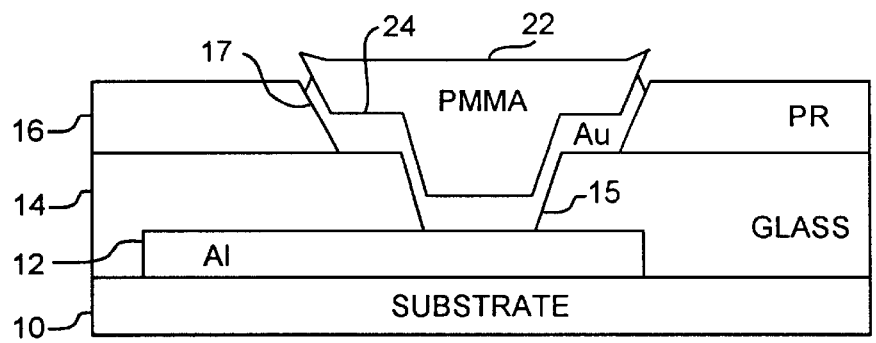
FIG. 1C    Au PATTERN ETCH
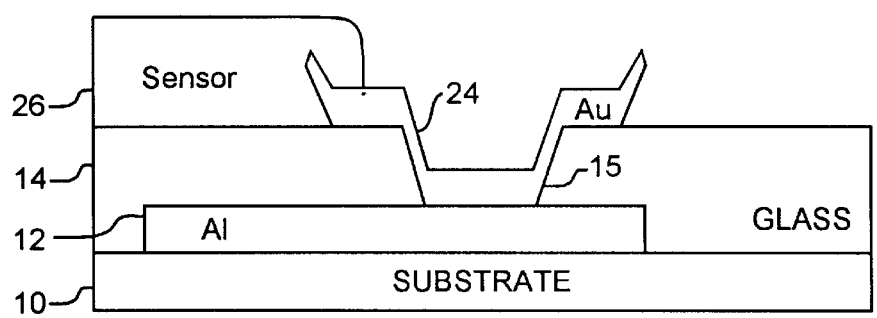
FIG. 1D    PR STRIP AND SENSOR DEPOSITION

GOLD CONTACT PMMA ETCH BACK PROCESS

METHOD OF FORMING PATTERNED METALIZATION ON PATTERNED SEMICONDUCTOR WAFERS

FIELD OF THE INVENTION

The invention relates to the field of semiconductor processing. More particularly the present invention relates to etch back methods for forming sensor contacts during thin film semiconductor processing.

BACKGROUND OF THE INVENTION

The microelectromechanical systems (MEMS) are being manufactured using process steps often found in traditional semiconductor processes. MEMS fabrication services are becoming widely used in many desirable developmental variations. The use of MEMS technology often presents difficult challenges when integrating MEMS devices into and with compatible semiconductor devices and processes. The semiconductor processes cover many types of devices and materials. One such semiconductor device and process is complementary metal oxide silicon (CMOS) technology. The CMOS process has been traditionally used for fabricating fast low power digital devices. Most MEMS devices are analog type devices. Complete system designs often require the speed and accuracy of modern digital computer processing systems that are coupled to the real world using analog input and output devices. Complete system designs lead to the integration of digital devices and analog devices on a chip with the advantage of an economy of scale. However, such integration of different devices and the corresponding different process steps must be accomplished with inherent compatibility. Many analog devices operate using gold connector contacts because gold is a good electrical conductor that is also non-corrosive and durable. Aluminum is a good conductor, but is highly corrosive, and not desirable for use as an exposed conducting contact. Gold is a large atom, and gold atomic migration through the lattice structures of semiconductor devices often leads to a decrease in the mean time between failure as gold atoms function as an impurity when migrating from an original deposition site. Though highly conductive, gold and silver impurities near the gate junctions of metal oxide silicon (MOS) transistors can lead to premature failures. Hence, in CMOS semiconductor circuits, often polysilicon, aluminum, and tungsten are used as conductors to avoid the migration problem when using gold or silver.

A sensor contact metal, such as gold or tungsten, can be deposited in a contact via well leading to a semiconductor device in a preexisting semiconductor circuit. For example, a sensor contact metal can be deposited over the contact via well with a potentially corrosive analog sensor then being deposited onto the sensor contact metal. The sensor contact metal can then be covered by a deposited protection layer to protect the sensor and contact metal from corrosion when the sensor is exposed to the environment. As a preexisting example, a silicon substrate may have an aluminum conducting etch run that is covered by an insulation layer such as silicon dioxide. During photoresist application, mask exposure and development, a contact via is formed through the photoresist. Photoresist is usually applied by spinning a coating onto a silicon wafer. The silicon dioxide layer is then etched in the location of the photoresist via to form the contact via through the silicon dioxide layer. The photoresist layer is then removed leaving the silicon dioxide layer over the aluminum conductor excepting for the contact via through the silicon dioxide layer. The formation of the contact via through the silicon dioxide layer to the conductor etch run of the semiconductor is an initial starting process point for depositing sensor contact metal upon a buried conductor etch run, prior to then depositing the sensor on the contact metal. The metal sensor contact is deposited as a layer and then patterned. The metal sensor contact should have profile that mates to the profile of the contact via well and extends up and over the insulation layer for contact with the sensor. Often, the metal contact will have a dimple over the contact via well as the metal is deposited evenly over the contour of the contact via well. Various processes have been used to accurately form the profile of the metal sensor contact during well filing.

The tape liftoff process applies an adhesive tape to the deposited sensor contact metal layer. The adhesive tape makes adhesive contact with the sensor contact metal except over the contact via where the dimple is created in the surface of the metal sensor contact layer. As the contact metal being is deposited down into the contact via well, a surface dimple is created. As the adhesive tape is pulled away from the metal sensor contact layer, the contact layer is removed, except where the dimples are located. Hence, the metal sensor contact survives and remains in the contact via wells. The tape liftoff process is imprecise in forming a metal sensor contact profile and creates ragged edges and stresses in the metal contact, leading to separation failures. Liftoff patterning processes require stepped slopes in the contact wells and constrain the metalization layer to small thicknesses. The Liftoff processes are incompatible with good step coverage and deposition techniques, such as sputtering.

The subtractive process also first deposits a metal sensor contact layer. Patterned photoresist portions are formed over the contact wells, exposing the metal contact layer but not over the contact well. The metal sensor contact layer is removed by a dissolving solution. The metal sensor contact layer is dissolved save the protected metal sensor contacts under the patterned photoresist portions. Then, the pattern photoresist portions are removed exposing the metal sensor contacts that have upwardly extending flanges created on the side walls of the metal contact via and lying upon the insulating layer. The problem with subtractive process is that during the metal sensor contact layer removal step, the metal sensor contacts are undercut under the edges of the pattern photoresist portions leading to imprecise metal sensor contact profiles and flange formation. The metal sensor contacts may also fail to sufficiently adhere to the subsequently deposited sensor.

The chlorobenzene liftoff process uses a single photoresist layer to create large sized sensor contact profiles, the flanges of which can be large. The chlorobenzene liftoff process creates a lip in the photoresist layer that can be damaged during sputtering or heated depositions leading to imprecise formation of the sensor contact profiles. Chemical hazards are disadvantageously created when using exotic and unfamiliar chemicals, such as chlorobenzene, to modify the photoresist.

The multiple layer photoresist process uses multiple layers of photoresist that when respectively repeatedly applied, exposed and then developed, create a thick photoresist via through which the metal sensor contact is deposited to create a unique gold contact profile. The multiple layer photoresist process suffers from the repeated photoresist steps and requires very accurate process controls.

As such, conventional techniques for contact formation disadvantageously suffer from imprecise formations leading undesirable profiles of the metal sensor contact. Often, the metalization layer, including the metal contact can have undesirable contours, such as the metal contact dimples. Conventional etch back methods have been used to remove undesirable surface contours of previously patterned layers. The etch back methods are used for ensuring continuous step coverage and for reflattening the surface for further high resolution photolithography. That is, the etch back method is applied to previously patterned layers. In the case of the CMOS planar etch back method, a metal contact layer, such as tungsten, is deposited over the contact well creating a dimple in the metal layer over the contact well. Because further processes may require substantially flat surfaces, the dimple is removed by a planar etch back process. An insulating layer, such as glass, is reflowed by heat, onto a metal layer. Phosphosilicate glass is applied by chemical vapor deposition and can be reflowed at high temperatures of about 700C. The reflowed glass layer is then etched back to expose the metal layer having surviving portions of the reflowed glass in the dimples. Next, the metal layer is etched back down to the insulation layer where the contact well is then filled with the metal and the surface is then substantially flat. The tungsten layer is effectively patterned into the wells solely by the preexisting lithography. Next, the metal layer is again deposited on a flat surface forming a metalization layer with a flat surface. The flat metalization surface can then be etched to pattern the metal layer without having the contact well dimples. This CMOS planar etch back process provides a metal contact profile that has no dimples. However, the CMOS planar etch back process disadvantageously required two metal deposition processes and two metal etching processes, and results in flat metal sensor flanges that may be unsuitable for connection to MEMS sensors. These and other disadvantages are solved or reduced using the invention.

SUMMARY OF THE INVENTION

An object of the invention is to provide a method for forming a metal contact in a contact well.

Another object of the invention is to provide a method for forming in a contact well, a metal contact having upwardly extending metal contact flanges.

Yet another object of the invention is to provide a method for forming in a contact well, a metal contact having a metal contact dimple.

Still another object of the invention is to provide a method for forming in a contact well, a metal contact having a metal contact dimple, and an upwardly extending metal contact flange.

Still a further object of the invention is to provide a method for forming in a contact well, a metal contact having a metal contact dimple, and an upwardly extending metal contact flange for connecting to a sensor.

A further object of the invention is to provide a method for forming in a contact well, a metal contact having a metal contact dimple, and an upwardly extending metal contact flange using polymethylmethacrylate (PMMA) etch back.

Yet a further object of the invention is to provide a method for forming in a contact well, a gold contact dimple, and an upwardly extending metal contact flange using PMMA etch back.

The method is directed to the fabrication of metalized well contacts, such as gold well contacts, for electrical connection between semiconductor microcircuits and microelectromechanical systems (MEMS) devices and sensors, using standard metalization and etch processes with a minimum of subsequent photolithographic processing tools and steps. The method can be performed on variously sized substrates. The method can be used in a variety of fabrication processes for integrating MEMS devices and sensors with semiconductor devices, and is particularly well suited for integrating chemical sensors with conventional metal oxide silicon (MOS) semiconductor processes, such as complementary metal oxide silicon (CMOS) processes. The method can be applied to MEMS devices integrated with conventional semiconductor processes, such as CMOS processes, that can not tolerate a heavy metal, such as a gold metal that acts as an impurity and leads to failure of many silicon devices.

In the preferred form, a complementary metal oxide silicon (CMOS) semiconductor process device, such as a CMOS amplifier having etch run connection under a metal contact well in an insulating layer, is connected to an organic sensor applied to a metal sensor contact in the metal contact well. In the preferred form, the contact metal is gold for electrochemical stability in the presence of a chemical sensor. The use of gold offers good electrical conductivity and high non-corrosiveness. The semiconductor device can be made on large diameter wafers and hence the method offers the potential of an economy of scale when integrating semiconductor processes with inherently incompatible MEMS devices and chemical sensors.

The method is particularly adapted to forming a metal contact with a desirable profile for secure contact with a corrosive chemical sensor. Particularly, a patterning layer, such as a photoresist (PR) layer, is deposited for forming a larger sized patterned contact via over the insulating layer via, for creating upwardly extending metal contact flanges. The patterned contact via effectively increases the well depth and width, while the sidewalls of the patterned contact via provide a bottom surface from which the flanges upwardly extend. The metalization contact layer, such as a gold layer, is deposited over the patterned contact via and insulation contact via in the insulation layer then forming the metal contact with the upwardly extending flanges and with a dimple in the metal contact layer over the contact via using a single metalization deposition step. After metalization, a thick planarization layer, such as a thick layer of PMMA is deposited for filling in the dimple. The planarization layer is then etched back exposing the metalization layer while the dimple and the upwardly extending flanges remain covered with the PPMA. The metalization layer is then removed save the metal contact protected by the PMMA within the contact dimple. The photoresist layer and the remaining PMMA in the contact dimple are then removed to expose the metal contact including the upwardly extending flanges. The flanges extend upward about the height of the PR layer. Hence, the PR layer is used to form the profile of the upwardly extending flanges of the metal contact. With the metal flanges extending upwardly, a chemical sensor or MEMS device can be deposited onto or connected to the upwardly extending flanges of the metal contact. The upwardly extending flange portion of the metal contact and the overall size and shape of the metal contact profile can be precisely formed. The metal contact is suitable for electrical contact between chemical sensors and the underlying semiconductor devices using a minimum number of process steps compatible with existing semiconductor processes. These and other advantages will become more apparent from the following detailed description of the preferred embodiment.

BRIEF DESCRIPTION OF THE DRAWINGS

FIG. 1A is diagram of layers after process deposition.

FIG. 1B is a diagram depicting the layers after polymethylmethacrylate (PMMA) etch back.

FIG. 1C is a diagram depicting the layers after gold pattern etch.

FIG. 1D is a diagram depicting the layers after sensor deposition.

DETAILED DESCRIPTION OF THE PREFERRED EMBODIMENT

Figure 2:
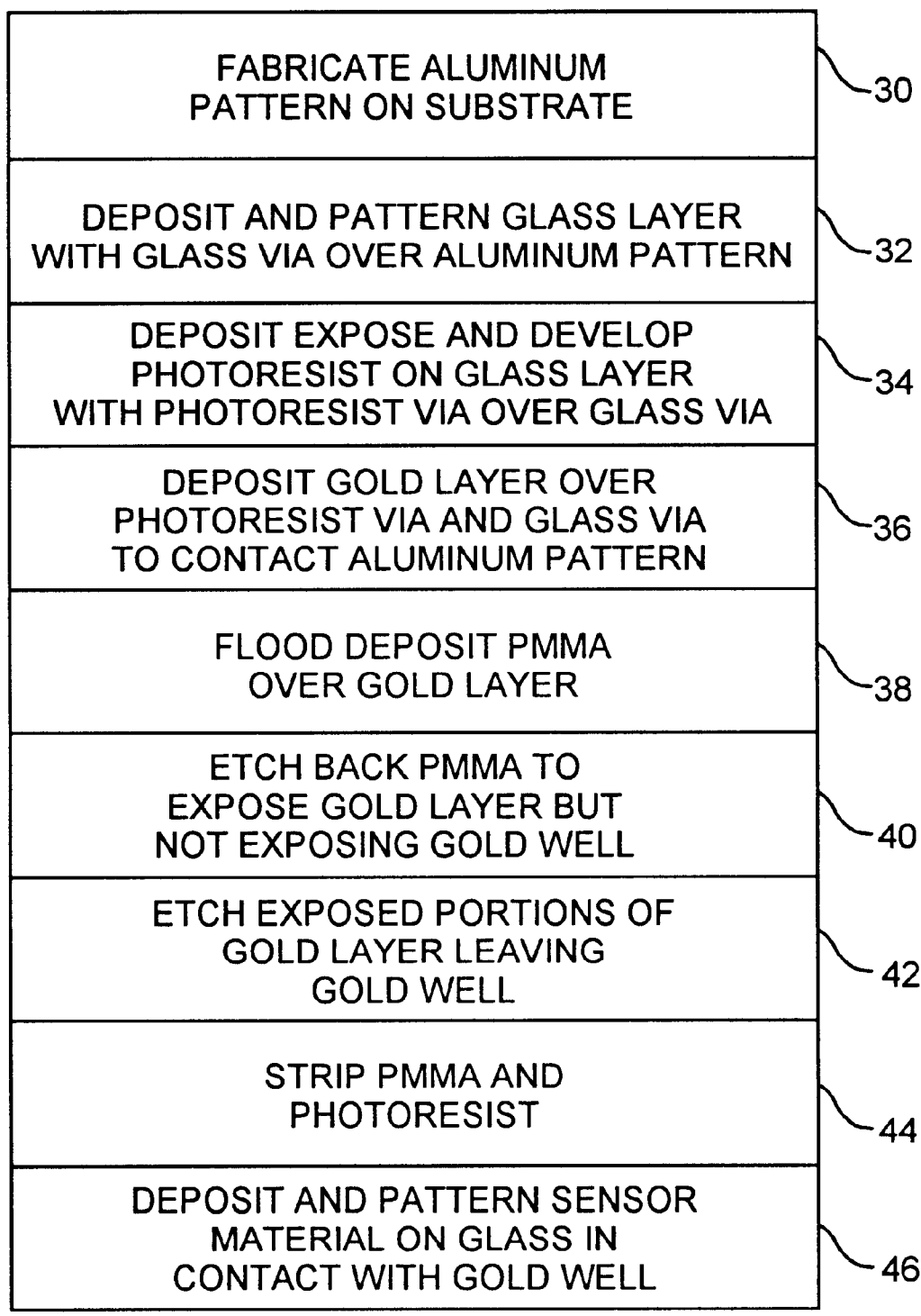
FIG. 2 is a flow diagram of the gold contact PMMA etch back process.

An embodiment of the invention is described with reference to the figures using reference designations as shown in the figures. Referring to both of the figures, a preexisting substrate 10, such as a silicon substrate may be supporting a semiconductor device, such as a CMOS device, comprising a conducting portion, such as aluminum layer 12, deposited during step 30. An insulating layer 14 is deposited during step 32. The insulating layer 14 is preferably a glass layer made of silicon dioxide. During step 32, a contact via 15 is formed as a passageway through the insulating layer 10 to the semiconductor device conducting layer 12. A via layer 16 is deposited over the insulation layer 14 during step 34. The via layer 16 is a patternable and removable layer, such as a preferred patterned photoresist (PR) layer. The via layer 16 is processed to form a flange via 17 that is larger than and centered over the contact via 15. After applying the via layer 16 to a desired thickness, exposing the via layer 16 for patterning, and developing for via layer 16 for flange via removal, the PR via layer 16 includes the flange via 17 that is substantially larger than the contact via 15 in the insulation layer 14. Then, the metalization layer 18, such as a sputtered gold (Au) layer, is deposited during step 36 over the via layer 16, into the flange via 17, into the contact via 15, and onto the conducting layer 12. As may be apparent, the via layer 16 serves to create a flange step in the dimpled portion of the metalization conduction layer 18 over the flange via 17. Next, an etch back planarization layer 20, such as a polymethylmethacrylate (PMMA) etch back layer 20, is deposited typically by flooding during step 38, over the conducting layer 18 and into the stepped dimple of the conducting metalization layer 18. The PMMA, planarization layer 20 is then etched back during step 40, to expose the conducting layer 18, but not to expose the stepped dimple of the conducting layer 18 then forming a surviving PMMA dimple portion 22 of the PMMA layer 20 that remains in the stepped dimple portion 24 of the conducting layer 18. The exposed portion of the conducting layer 18 is then removed during step 42, typically by chemical etching, for exposing surviving portions of the via layer 16, with the contact dimple portion, that is, the metal contact 24 surviving under the surviving PMMA dimple portion 22 of the PMMA planarization layer 20. The surviving portion 22 of the planarization layer and the PR layer 16 are removed during step 44 to fully expose the metal contact 24. As may now be apparent, the metal contact 24 has upwardly extending flanges, shown on the left side and right side of the profile of the metal contact 24. Finally, a MEMS device, such as a chemical sensor 26, can be connected to or patterned onto the substrate 10 by direct deposition onto the semiconductor device insulation layer 14 in electrical contact with the metal contact 24. The metal contact 24 provide an electrical connection between the conduction layer 12 of a semiconductor device and the MEMS sensor device 26. An upwardly extending flange of the metal contact 24 is in electrical contact with and can penetrate into the sensor device 26 so that the metal contact 24 makes good electrical connection between the sensor device 26 and the semiconductor device conductor 12.

The via layer 16 has the flange via 17 having a sloped side wall that particularly serves to form a sloping surviving portion of the conducting layer 18 that becomes the upwardly extending flange of the metal contact 24 after removing the exposed portions of the conducting layer 18 and the patterning via layer 16. Using PR for the via layer 16, the PR will not be under cut over the conducting layer 18. Modest proximal migration of the gold atoms about the contact 24 over the conduction layer 12 should be distal to locations where gold impurity might cause failure in a distal semiconductor device, not shown, connected to the MEMS device 26 through the conducting layer 12. In this manner, MEMS devices or chemical sensor devices can be integrated with semiconductor devices on the same semiconductor substrate 10 without detrimental atomic migration effects.

The PMMA etch back method can use industry standard photoresist patterning processes on the wafer to define the pattern of the subsequently applied metalization layer 18. The method takes advantage of high resolution photolithography, high reliability, and large wafer processes that can be performed in large volumes to offset the cost of expensive equipment without conflict to process compatibility. The method enables arbitrary metalization or conducting etch run patterning between the MEMS devices 26 and the semiconductor devices. The metalization or conducting run patterns are derived from high resolution photolithographic processes thereby conforming to and integrating with the underlying small scale semiconductor devices, such as CMOS semiconductor devices.

In the preferred form, the gold metalization layer 18 is applied over the wafer including the substrate 10 and over the PR layer 16 covering the whole wafer. The metalization layer can be deposited by vacuum evaporation or sputtering. A flowable thermoplastic planarization layer 20, such as the PMMA layer 20, is applied to the wafer and over the metalization layer 18. Surface tension of the thermoplastic planarization layer 20 tends to form a nearly planar top surface over underlying contours including the underlying contact dimples. Typically, the PMMA is applied during spin coating as a solution of the thermoplastic material in a volatile solvent. The planarization layer 20 may also be applied by reflow during heating and melting of the thermoplastic material. Flowable inorganic substances may be used for the planarization layer 20 as well. The planarization layer 20 provides a thick flat surface that can be uniformly etched and removed down to the conduction layer 18 so as to cover the dimple portion 22 and protect the metal contact 24 including the upwardly extending flanges from being removed during chemical removal of the metalization layer 18. The etch back is a planar surface removal process typically performed by etching or lapping at a controlled rate and uniformly across the wafer, such as by oxygen plasma processing, until the underlying metalization layer 18 is exposed at high points but not at low points of the underlying contours of the top surface of the metalization layer 18. When PR is used as the via layer 16, the photoresist tends to dominate the contour of the top surface of the conduction layer 18. The exposed portion of the metalization layer 18 is etched selectively with conventional techniques that erode completely through the metal layer 18. Typically, metalization often consists of two or three functional layers, for various functions including adhesion, diffusion barrier, and electrical conductivity. Sufficient metalization etching would then be needed to remove all of the functional layers of the metalization layer 18 in the exposed areas so as to expose the via layer 16 but not the metal contact 24.

For isotropic etchants such as wet chemicals, some recession of the metal edge occurs as an over etch margin. The nearly vertical portions of the metalization, covering the slopes of the resist, tend to provide some sacrificial etch distance, allowing over etching to occur without degrading the lateral dimensions of the metalization pattern. The method is well suited for wet chemical etching. The flowable plastic of the planarization layer and the PR of the via layer should be removed by processes that do not attack the underlying wafer or the applied metalization layer 18. For example, organic solvents or oxygen plasma may be used.

In a broad sense, the etch back method is positively used to create profile features of a metal contact, that is, the upwardly extending flanges of metal contact 24. The etch back method is used to define the actual shape of the metalization layer 18 disposed on the via layer 16 and under the planarization layer 20. The PR is used to not only pattern the metalization layer 18 into the contact via 15, but also to form vertical aspects of the profile of the metal contact. The method is applicable to a variety of semiconductor materials and metals, such as polysilicon or tungsten. The use of a via layer 16, such as the relatively vulnerable photoresist, under the conducting material layer 18, offers an ability to uniquely form the conducting layer 18 in the vertical dimension, in combination with a subsequent etch back layer 22, that is preferably a plastic coating planarization layer 20. In the broad aspect, the method provides a process sequence for forming desired three dimensional conductive metal contact structures. In the preferred form, the contract 24 is used to electrically connect an underlying semiconductor device with an overlying MEMS device integrated on the same substrate, but is applied generally for forming the profile of the metal contact 24. The method offers a standard semiconductor integration process for MEMS devices or chemical sensor devices with standardized semiconductor devices using a variety of conventional materials. Those skilled in the art can make enhancements, improvements, and modifications to the invention, and these enhancements, improvements, and modifications may nonetheless fall within the spirit and scope of the following claims.

What is claimed is:

1. A method of forming a contact for connecting to a circuit having a conductor accessible through a contact via in an insulating layer deposited on a substrate, the method comprising the steps of, via layer depositing and patterning a via layer over the insulating layer, the via layer having a flange via over the contact via, conducting layer depositing a conducting layer over the via layer, the conducting layer being deposited onto the conductor through the contact via and the flange via, the conducting layer forming a stepped contact dimple contact via and the flange via, etch back layer depositing an etch back layer over the conducting layer and over the contact via and over the flange via, a top surface of the etch back layer over the contact via and flange via is higher than a top surface of the conducting layer, back etching the etch back layer for exposing an exposed portion of the conducting layer for providing a surviving etch back dimple portion of the etch back layer over the contact via and the flange via, the etch back dimple portion of the etch back layer covering a conducting dimple portion of the conduction layer, and exposed portion removing the exposed portion of the conducting layer, the conducting dimple portion becoming the contact.

2. The method of claim 1 further comprising the step of dimple portion removing the etch back dimple portion for exposing the contact.

3. The method of claim 1 wherein, flange via is an aperture in the via layer, contact via is an aperture in the insulation layer, and flange via aperture is greater in size than the contact via aperture.

4. The method of claim 1 wherein, the substrate is a silicon substrate, the insulation layer is a silicon dioxide insulation layer, and the conductor is a metal.

5. The method of claim 1 wherein, the via layer is photoresist.

6. The method of claim 1 wherein, the etch back layer is PMMA.

7. The method of claim 1 wherein, the conductor layer is a gold layer.

8. The method of claim 1 wherein, the conductor layer is polysilicon.

9. The method of claim 1 wherein, the circuit is a CMOS circuit.

10. The method of claim 1 wherein, the conductor layer is a composite conducting layer comprising an adhesion layer, a barrier layer, and a conduction layer.

11. The method of claim 1 wherein, the insulation layer is glass.

12. The method of claim 1 wherein the etch back deposition step, the etch back layer is deposited by spin flooding.

13. The method of claim 1 wherein the via layer is made of photoresist and the via layer deposition step comprises the steps of, applying the photoresist, mask exposing the photoresist, and developing the photoresist.

14. A method of forming a contact for connecting a device to a circuit having a conductor accessible through a contact via in an insulating layer deposited on a substrate, the method comprising the steps of, via layer depositing and patterning a via layer over the insulating layer, the via layer having a flange via over the contact via, conducting layer depositing a conducting layer over the via layer, the conducting layer being depositing onto the conductor through the contact via and the flange via, the conducting layer forming a stepped contact dimple contact via and the flange via, etch back layer depositing an etch back layer over the conducting layer and over the contact via and over the flange via, a top surface of the etch back layer over the contact via and flange via is higher than a top surface of the conducting layer, back etching the etch back layer for exposing an exposed portion of the conducting layer for providing a surviving etch back dimple portion of the etch back layer over the contact via and the flange via, the etch back dimple portion of the etch back layer covering a conducting dimple portion of the conduction layer, exposed portion removing the exposed portion of the conducting layer, the conducting dimple portion becoming the contact having an upwardly extending flange upwardly extending from the insulation layer, dimple portion removing the etch back dimple portion, and device depositing the device onto the upwardly extending flange.

15. The method of claim 14 wherein,
the device is a chemical sensor.
16. The method of claim 14 wherein,
the via layer is photoresist,
the etch back layer is PMMA,
the conductor layer is a gold layer,
the circuit is a CMOS circuit, and
the device is a MEMS device.
17. The method of claim 14 wherein,
the via layer is photoresist,
the etch back layer is PMMA,
the conductor layer is a gold layer,
the circuit is a CMOS circuit, and
the device is a chemical sensor.
18. The method of claim 14 wherein,
the via layer is photoresist,
the etch back layer is PMMA,
the conductor layer is a gold layer,
the circuit is a CMOS circuit, and
the device is a biochemical sensor.
19. The method of claim 14 wherein,
the via layer is photoresist,
the etch back layer is PMMA,
the conductor layer is a gold layer,
the circuit is a CMOS circuit,
the device is a chemical sensor,
flange via is an aperture in the via layer,
contact via is an aperture in the insulation layer,
flange via aperture is greater in size than the contact via aperture,
the substrate is a silicon substrate,
the insulation layer is a silicon dioxide insulation layer, and
the conductor is a metal.

* * * * *